United States Patent [19]
Lee et al.

[11] Patent Number: 5,970,114
[45] Date of Patent: Oct. 19, 1999

[54] X-RAY MASK AND ITS FABRICATION METHOD

[75] Inventors: Don-Hee Lee, Kyungki-do; Ki-Chang Song, Seoul; Young-Sam Jeon; Chil-Keun Park, both of Kyungki-do, all of Rep. of Korea

[73] Assignee: LG Semicon Co., Ltd., Chungcheongbuk-Do, Rep. of Korea

[21] Appl. No.: 08/919,812

[22] Filed: Aug. 29, 1997

[30] Foreign Application Priority Data

Aug. 31, 1996 [KR] Rep. of Korea ................... 96/37538

[51] Int. Cl.[6] ............................................. G21K 5/00
[52] U.S. Cl. ..................................... 378/35; 378/210
[58] Field of Search ....................................... 378/35

[56] References Cited

U.S. PATENT DOCUMENTS 4,152,601  5/1979  Kadota et al. ..................... 378/35
4,515,876  5/1985  Yoshihara et al. ................. 378/35

Primary Examiner—Craig E. Church

[57] ABSTRACT

Disclosed are X-ray masks exhibiting improved stability and reliability of the X-ray masks, and methods of making these masks. The X-ray masks include a membrane, an X-ray absorber pattern on the membrane, which is formed on a top side of a substrate, or an oxide layer between the membrane and the X-ray absorber pattern.

11 Claims, 7 Drawing Sheets

X-RAY MASK AND ITS FABRICATION METHOD

BACKGROUND OF THE INVENTION

1. Field of the Invention

The present invention relates to a mask and, more particularly, to an X-ray mask and its fabrication method thereof.

2. Discussion of Related Art

Optical lithography exposure techniques have reached their technical and economical limitations as current leading techniques in the semiconductor industry. As a substitute for the exposure techniques, an X-ray lithography technique is suggested. In the X-ray lithography technique, the most important factor is the development of an X-ray mask.

FIGS. 1A to 1D are cross-sectional views illustrating a process for fabricating an X-ray mask according to a conventional subtractive method. In the conventional subtractive method, the X-ray mask is fabricated by forming an X-ray absorber pattern first and then forming a resist. The resist is treated using an e-beam, i.e., electron beam, lithographic technique to form a resist pattern.

Referring to FIG. 1A, a thin membrane 11 is formed on a silicon substrate 10. The thin membrane 11 is formed from a material such as silicon carbide (SiC), silicon nitride (SiN), or diamond. An etching mask film is then deposited on a bottom surface of the silicon substrate 10 and patterned to form an etching mask 12. The etching mask 12 is used to expose a designated portion of the silicon substrate 10. The exposed designated portion of the silicon substrate 10 is anisotropically etched using a silicon etching solution such as KOH. By using the etching mask film 12, a trench area 18 is formed. The trench area 18 allows for an X-ray to pass through the X-ray mask in that area without passing through the silicon substrate.

Next, an X-ray absorber 13 is deposited on the membrane 11 using a thin layer deposition technique such as a sputtering technique. The X-ray absorber 13 is formed from one material of tungsten (W), tantalum (Ta) and tungsten titanium (W-Ti). Such materials have a high absorbtivity characteristic for an X-ray.

As shown in FIG. 1B, a hard mask 14 is deposited on the X-ray absorber 13. A resist is formed on the hard mask 14 and patterned using e-beam lithography technique to form a resist pattern 15 that has a designated shape. After forming the resist pattern 15, the hard mask 14 is then exposed.

Referring to FIG. 1C, the hard mask 14 is selectively removed using a dry etching technique that uses the resist pattern 15 as a mask. Thus, a hard mask pattern 14' is formed that allows for the X-ray absorber 13 to be exposed.

As shown in FIG. 1D, the exposed portions of the X-ray absorber 13 are etched using the hard mask pattern 14' as a mask. Thus, portions of the X-ray absorber 13 underneath the hard mask pattern 14' remain along with the hard mask pattern 14'. As a result, an X-ray absorber patter 13' is formed thereby completing the X-ray mask.

FIGS. 2A–2D are cross-sectional views illustrating the process for fabricating an X-ray mask according to a conventional additive method.

In the conventional additive method, the X-ray mask is fabricated by selectively plating an X-ray absorber on a resist pattern which is previously formed.

Referring to FIG. 2A, a thin membrane 21 is formed on a silicon substrate 20. The thin membrane 21 is formed from a material such as silicon carbide (SiC), silicon nitride (SiN), or diamond. An etching mask film is then deposited on the bottom surface of the silicon substrate 20 and patterned to form an etching mask pattern 22 that exposes a designated portion of the silicon substrate 20. The exposed designated portion of the silicon substrate 20 is anisotropically etched using the etching mask pattern 22 to form a trench area 28. Like in the conventional subtractive method, the conventional additive method forms the trench area 28 that allows an X-ray to pass through the X-ray mask in that area without passing through the silicon substrate. Then, a seed metal layer 23 is formed on the membrane 21. The seed metal layer 23 is formed from Au/Cr.

As shown in FIG. 2B, a resist is then coated on the seed metal layer 23 and using e-beam lithography technique, a resist pattern 24 is formed having a designated shape. As shown in FIG. 2C, the resist pattern 24 is plated with a gold X-ray absorber 25, thus completing an X-ray mask.

The conventional methods for fabricating an X-ray mask have the following problems.

In the conventional subtractive method, when the resist is patterned with an electron beam, it is difficult to obtain an accurate pattern of the resist because of back scattering of the electron beam caused by the X-ray absorber that is previously formed. Also, another process is required for forming a hard mask between the absorber and resist to prevent the absorber from being removed by dry etching during the patterning of the resist since the etching rate of the resist is higher than that of the absorber. That is, without the hard mask, the absorber would also be etched as the resist is being etched.

In the conventional additive method, the electroplating process has difficulty controlling line widths below 0.18 microns. Also, the gold absorber has no minute structure due to its low density, thus deforming the mask by the incident X-ray into the absorber. The gold plated absorber of the conventional method has imperfections in the form of impurities, pores and grain boundaries. These imperfections lower the density of the gold plated absorber. The impurities and pores have thermal expansion characteristics that are different than intrinsic gold. When the gold plated absorber absorbs X-rays, the imperfections cause it to exhibit non-uniform thermal expansion. As a result, stress is generated in the gold plated absorber which deforms the pattern into which it is shaped.

The conventional method also requires the use of another process to remove the seed metal on the portion having no absorber thereon after the absorber is formed because the seed metal layer deteriorates the transparency to visible light, e.g., 633 nm wavelength of an He-Ne laser, of the X-ray mask.

SUMMARY OF THE INVENTION

Accordingly, the present invention is directed to an X-ray mask and its fabricating method that substantially obviates one or more of the problems due to limitations and disadvantages of the related art.

An object of the present invention is to provide an X-ray mask and its fabricating method that improves the surface of the X-ray mask.

Another object of the present invention is to provide an X-ray mask and its fabricating method without causing displacement of the X-ray absorber pattern on the X-ray mask.

Still another object of the present invention is to provide an X-ray mask and its fabricating method that allows for a stable mask using a second oxide layer with a higher etching selectivity that a first oxide layer.

To achieve these and other advantages and in accordance with the purpose of the present invention, as embodied and broadly described, there is provided a method of forming an X-ray mask that includes the steps of: providing a substrate; forming a membrane on the substrate; forming an oxide layer pattern on the membrane; forming an X-ray absorber layer on the oxide layer pattern; and selectively removing the oxide layer pattern and portions of the X-ray absorber layer to form an X-ray absorber pattern.

In another aspect of the present invention, there is provided an X-ray mask that includes: a substrate; a membrane formed on a top side of the substrate; an oxide layer formed on the membrane; and an X-ray absorber pattern formed on the first oxide layer.

In still another aspect of the present invention provides a method of forming an X-ray mask that includes the steps of: providing a substrate; forming a membrane on a top side of the substrate; forming a first oxide layer on the membrane; forming a second oxide layer on the first oxide layer; selectively removing the second oxide layer to form a second oxide layer pattern that exposes portions of the first oxide layer; forming an X-ray absorber layer on the second oxide layer pattern and on the exposed portions of the first oxide layer; and selectively removing the second oxide layer pattern and portions of the X-ray absorber layer to from an X-ray absorber pattern on the first oxide layer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE ATTACHED DRAWINGS

The present invention will become more fully understood from the detailed description given hereinbelow and the accompanying drawings which are given by way of illustration only, and thus are not limitative of the present invention, and wherein.

DETAILED DESCRIPTION OF PREFERRED EMBODIMENT

Reference will now be made in detail to the preferred embodiments of the present invention, examples of which are illustrated in the accompanying drawings.

FIGS. 3A–3F are cross-sectional views illustrating the process for fabricating an X-ray mask according to a first preferred embodiment of the present invention.

Figure 1A:
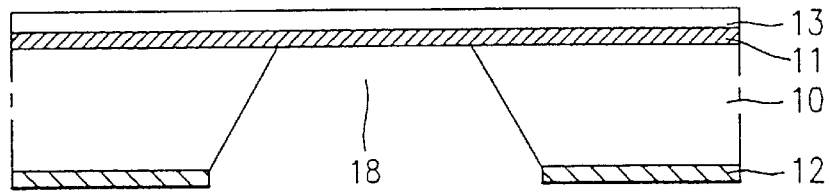
FIGS. 1A–1D are cross-sectional views illustrating the process for fabricating an X-ray mask according to a conventional subtractive method.
Figure 1B:
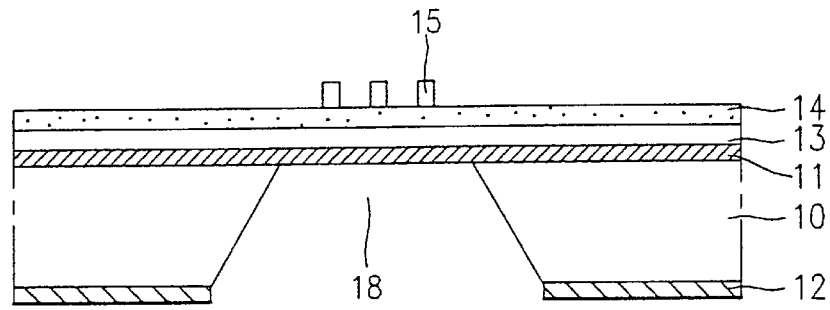
Figure 1C:
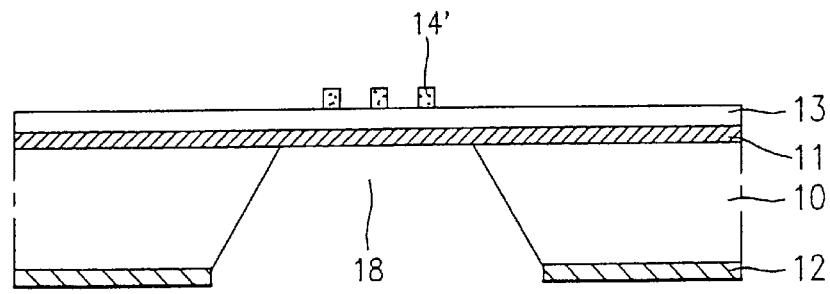
Figure 1D:
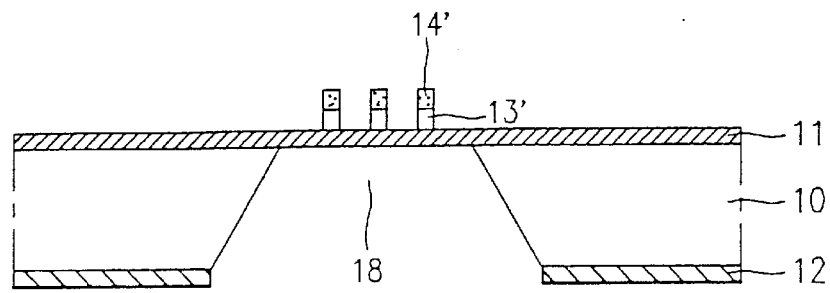
Figure 2A:
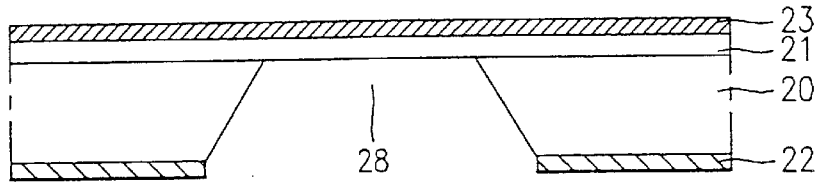
FIGS. 2A–2D are cross-sectional views illustrating the process for fabricating an X-ray mask according to a conventional additive method.
Figure 2B:
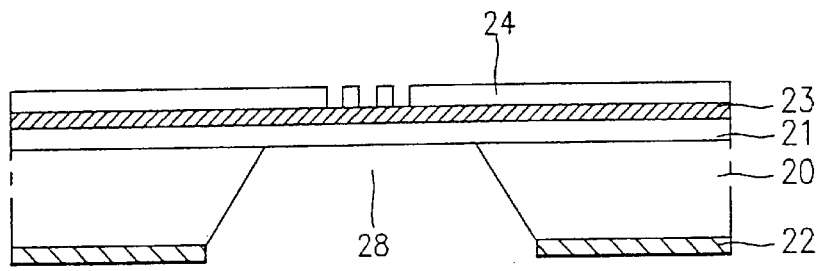
Figure 2C:
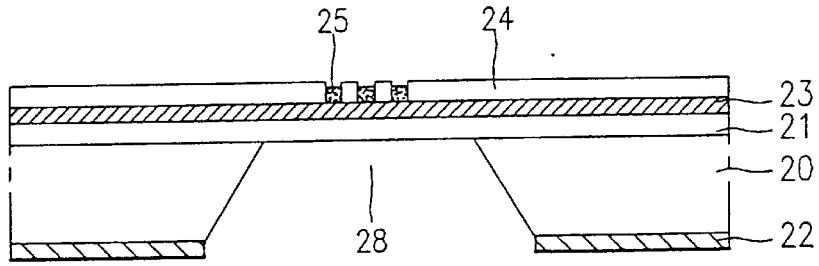
Figure 2D:
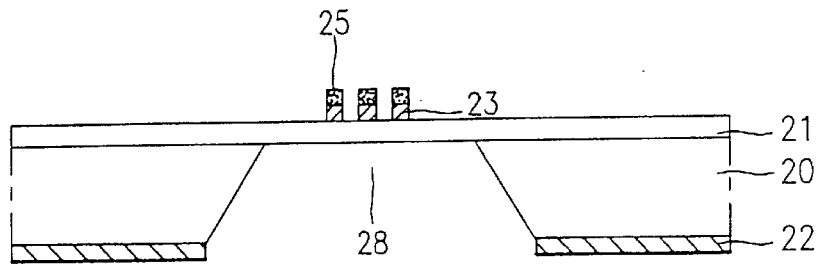
Figure 3A:
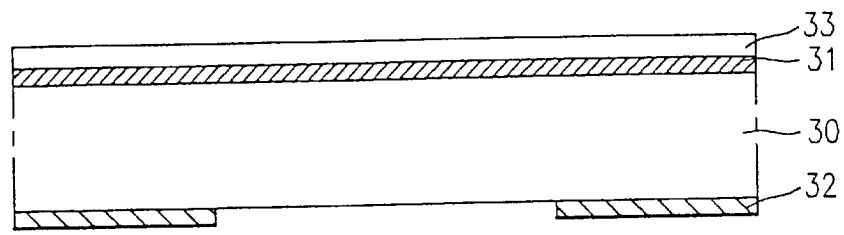
FIGS. 3A–3F are cross-sectional views illustrating the process for fabricating an X-ray mask according to a first preferred embodiment of the present invention.

As shown in FIG. 3A, a membrane 31 is formed on a silicon substrate 30, e.g., using an LPCVD (Low Pressure Chemical Vapor Deposition) process. Such a process is performed by using thin layer deposition equipment. Then, an etching mask film is formed on the bottom surface of the silicon substrate 30 and patterned to form an etching mask 32. The etching mask 32 allows for a designated portion of the semiconductor substrate 30 to be exposed. The membrane 31 is, preferably, formed from a silicon nitride (SiN) type material, a silicon carbide (SiC) type material, or a diamond type material. The etching mask film 32 is, preferably, formed from a silicon nitride (SiN) type material or silicon carbide (SiC) type material.

Figure 3B:
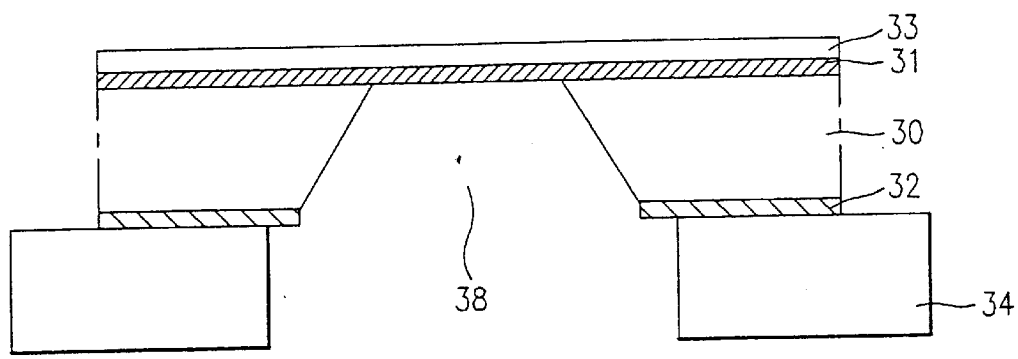

As shown in FIG. 3B, an oxide layer 33 is formed on the membrane 31. The oxide layer 33 is, preferably, formed from a silicon oxide ($SiO_2$) type material, SOG (Spin On Glass) type material, or an ITO (Indium Tin Oxide) type material. A support 34 is attached onto the etching mask 32. A trench 38 is formed in the bottom surface of the silicon substrate 30 by anisotropically etching the exposed portion of the silicon substrate 30. The etching process uses the etching mask 32 to etch the exposed designated portion of the semiconductor substrate 30 using an etching solution such as KOH. The trench area 38 allows for an X-ray to pass through the X-ray mask without passing through the silicon substrate.

The support 34 is attached onto the etching mask 32 prior to forming the X-ray absorber pattern. The purpose of the support 34 is to prevent any displacement of the X-ray absorber pattern when etching the silicon substrate 30 to form the trench 38. The displacement is caused by bonding stress during the etching process.

Figure 3C:
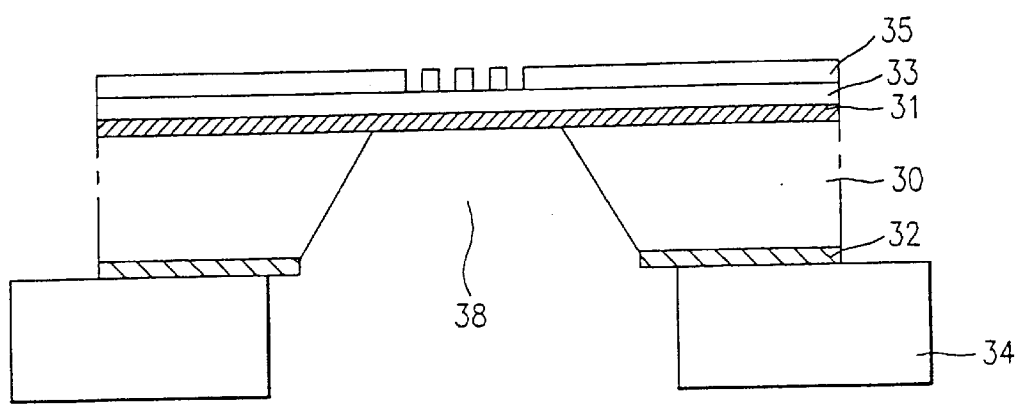

As shown in FIG. 3C, a resist is coated on the oxide layer 33 and patterned by an electron beam. Thus, a patterned resist 35 is formed on the oxide layer 33. The patterned resist 35 has, preferably, a multiple tooth shape above the trench area 38. However, the patterned resist 35 could take any number of shapes depending on the type of X-ray pattern required.

Figure 3D:
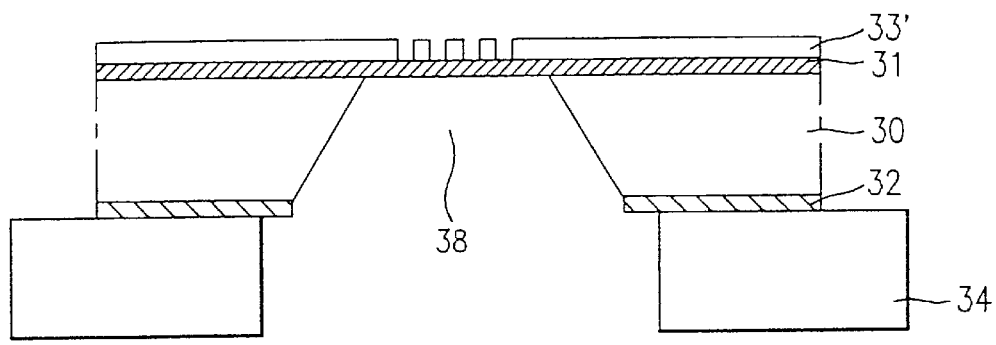

Referring to FIG. 3D, the oxide layer 33 is dry-etched by using the patterned resist 35 as a mask. The remaining patterned resist 35 is removed to form an oxide layer pattern 337 for forming an X-ray absorber pattern. The shape of the oxide layer pattern 33' is dictated by the shape of the patterned resist 35.

Figure 3E:
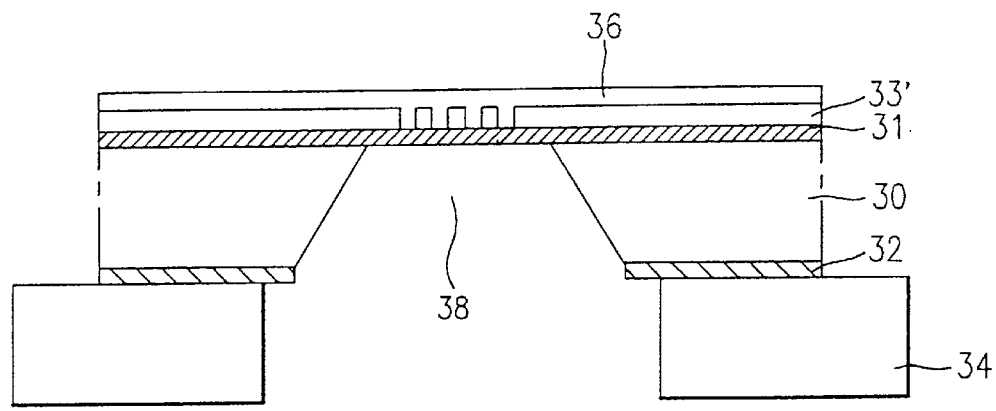

As shown in FIG. 3E, an X-ray absorber 36 is formed by depositing a material having a high X-ray absorbtivity on the oxide layer pattern 33' using a sputtering process. The X-ray absorber 36, preferably, comprises of an alloy formed from tungsten (W), tantalum (Ta), tungsten titanium (W/Ti), or a combination of at least two of the above alloys.

Figure 3F:
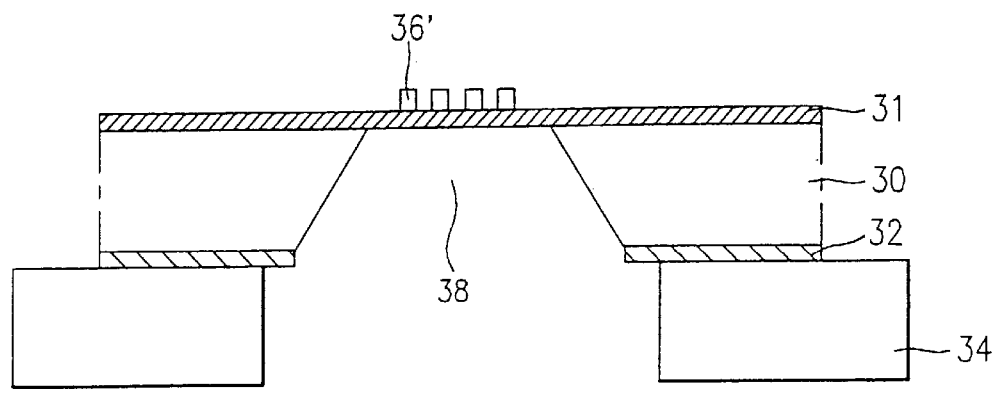

As shown in FIG. 3F, the oxide layer 33' is etched using an etching solution such as a BOE (Buffered Oxide Etchant) that removes the oxide layer pattern 33'. The oxide layer 33' is etched to a designated depth that allows the X-ray absorber 36 to remain on the membrane 31 thereby forming an X-ray absorber pattern 36'. Thus the above process completes the X-ray mask.

Figure 4:
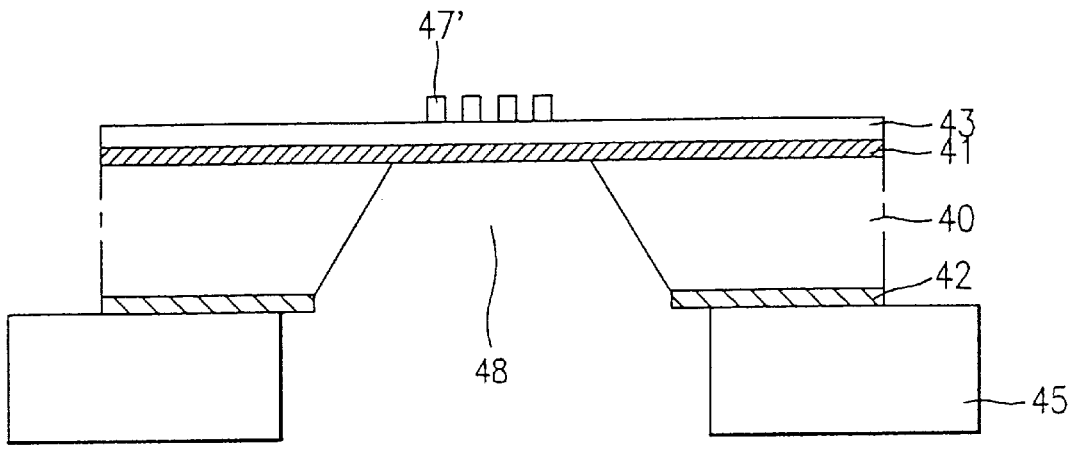
FIG. 4 is a cross-sectional view of an X-ray mask according to a second preferred embodiment of the present invention.

FIG. 4 is a cross-sectional view of an X-ray mask according to a second preferred embodiment of the present invention.

Referring to FIG. 4, the X-ray mask comprises a substrate 40 having a trench area 48 formed therein. The trench area 48 is formed in the bottom surface of the substrate 40. An etching mask 42 is formed on the bottom surface of the substrate 40. A support 45 is attached onto the etching mask 42. A membrane 41 is formed on the top surface of the substrate 40, and an oxide layer 43 is formed on the membrane 41. An X-ray absorber pattern 47' is formed on the oxide layer 43. The shape of the X-ray absorber pattern 47' is dictated by the type of X-ray pattern required. The oxide layer 43 is, preferably, formed from one of an aluminum oxide ($Al_2O_3$) type material, a magnesium oxide (MgO) type material, or an ITO (Indium Tin Oxide) type material.

FIGS. 5A–5F are cross-sectional views illustrating the process for fabricating an X-ray mask, as shown in FIG. 4, according to the second preferred embodiment of the present invention.

Figure 5A:
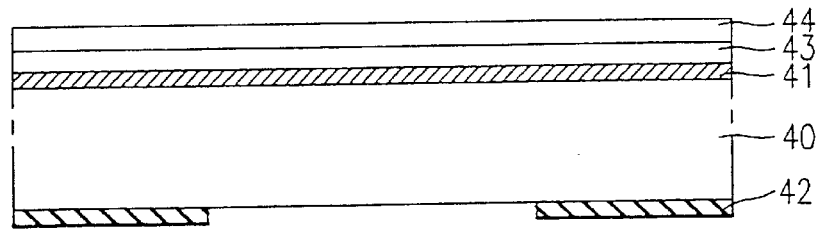
FIGS. 5A–5F are cross-sectional views illustrating the process for fabricating an X-ray mask according to the second preferred embodiment of the present invention.

Referring to FIG. 5A, a membrane 41 is formed on a silicon substrate 40 using, e.g., a LPCVD (Low Pressure Chemical Vapor Deposition) process. Such a process can be performed by using, e.g., thin layer deposition equipment. An etching mask 42 is then formed on the bottom surface of the silicon substrate 40 having the membrane 41 thereon. The etching mask 42 allows for a designated portion of the silicon substrate 40 to be exposed. The exposed designated portion is dry etched in a subsequent step. The membrane 41 is, preferably, formed from a silicon nitride (SiN) type material, a silicon carbide (SiC) type material, or a diamond type material. The etching mask 42 is formed, e.g., silicon nitride or silicon carbide.

Figure 5B:
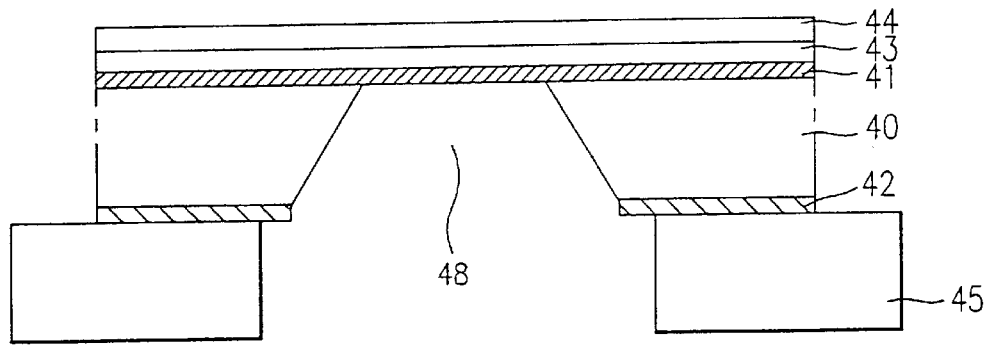

As shown in FIG. 5B, a first oxide layer 43, i.e., a transparency layer, is formed on the membrane 41. The first oxide layer is, preferably, formed from an aluminum oxide ($Al_2O_3$) type material, a magnesium oxide (MgO) type material, or an ITO (Indium Tin Oxide) type material. A second oxide layer 44 is then formed on the first oxide layer 43. The second oxide layer is, e.g., a silicon oxide type material or a PSG type material, which are materials having an etching selectivity higher than the first oxide layer 43 when etching with a solution such as a BOE. A support 45 is bonded onto the etching mask 42. The exposed designated portion of the silicon substrate 40 is anisotropically etched using a silicon isotropic etching solution such as KOH. In addition, the etching mask 42 allows for the exposed portion to be etched to form the trench area 48.

The support 45 is attached onto the etching mask 42 prior to forming the X-ray absorber pattern. The purpose of the support 45 is to prevent displacement of the X-ray absorber pattern caused by bonding stress when etching the silicon substrate 40 to form the trench 48.

Figure 5C:
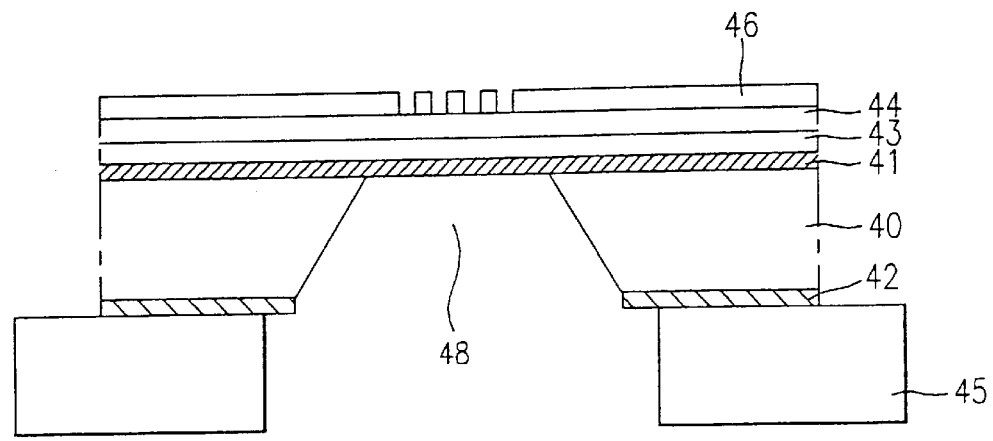

As shown in FIG. 5C, a resist is coated on the second oxide layer 44 and patterned by an electron beam to form a patterned resist 46. The patterned resist 46 has a designated shape which is dictated by the type of X-ray pattern required.

Figure 5D:
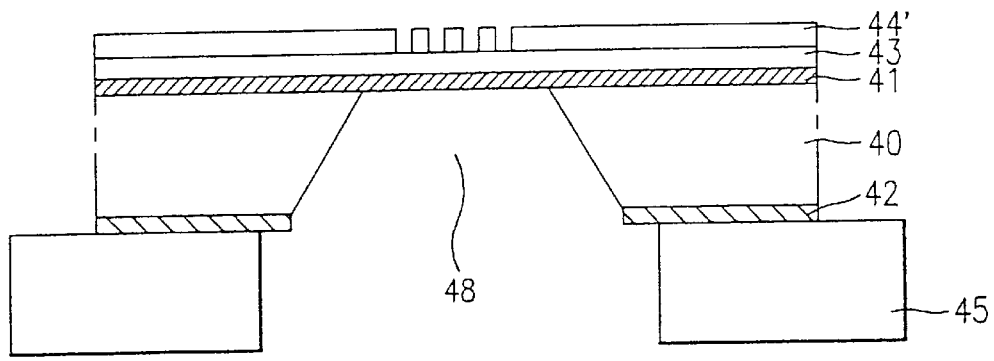

Referring to FIG. 5D, the second oxide layer 44 is dry-etched by using the patterned resist 46 as a mask. The remaining patterned resist 46 is removed to form a second oxide layer pattern 44' which is used in forming an X-ray absorber pattern.

Figure 5E:
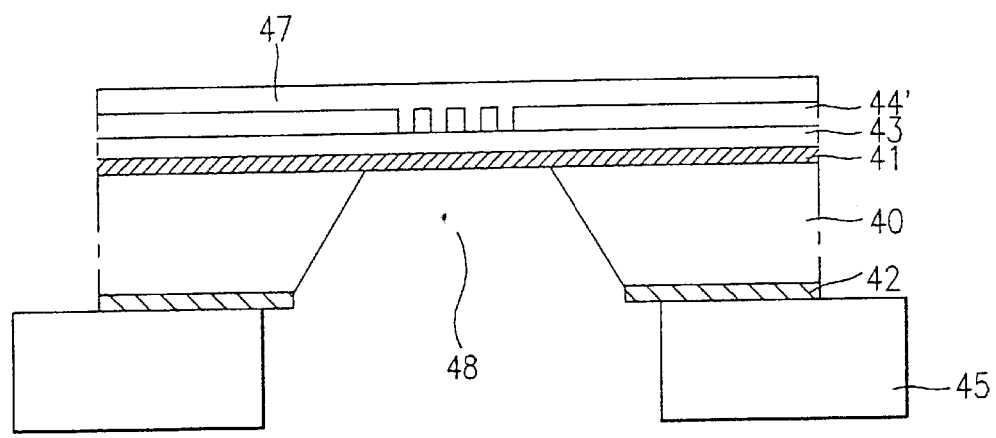

As shown in FIG. 5E, an X-ray absorber 47 is formed on the second oxide layer pattern 441. The X-ray absorber 47 is formed by depositing a material having a high X-ray absorbtivity using a sputtering process. The X-ray absorber 47 comprises, preferably, of an alloy from a tungsten (W) type material, a tantalum (Ta) type material, a tungsten titanium (W/Ti) type material, or a combination of at least two of the above type materials.

Figure 5F:
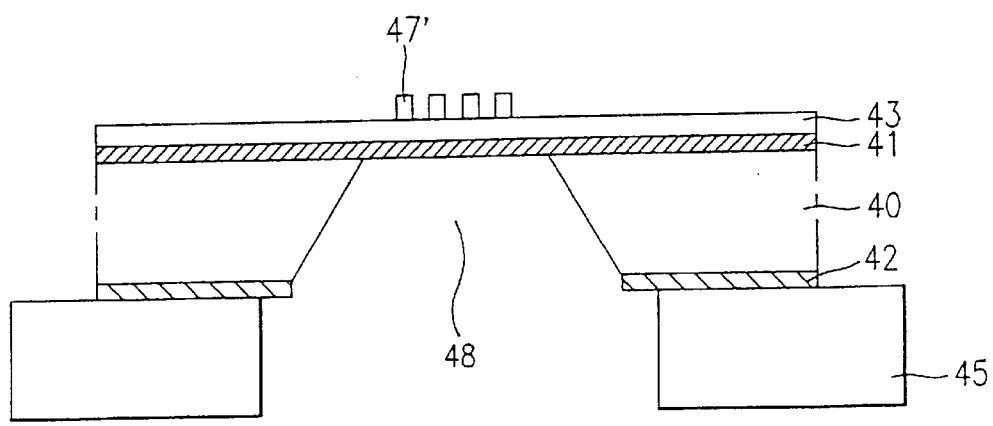

As shown in FIG. 5F, the second oxide layer pattern 44' is etched to a designated depth that removes the second oxide layer pattern 44'. The second oxide layer pattern 44' is removed using an oxide etching solution such as a BOE. Also, etching of the second oxide layer pattern 44' allows for the X-ray absorber 47 near the tooth shape pattern of the second oxide layer pattern 44' to remain and so form the X-ray absorber pattern 47'. Thus, the above process steps completes an X-ray mask whereby the X-ray absorber pattern 47' selectively blocks X-rays from passing through that allows an X-ray pattern to be formed.

According to the first and second embodiments of the present invention, back scattering of electrons is reduced when patterning the resist with an electron beam after the X-ray absorber is formed. As a result, displacement of the X-ray absorber pattern is reduced. Also, the accuracy of the patterned resist shape may be drastically enhanced to increase the repeatability of forming an X-ray mask.

According to the second preferred embodiment of the present invention, the exposed surface that would otherwise correspond to the rough membrane surface corresponds to the first oxide layer formed thereon and, hence, is smoothed. The exposed surface of the membrane is rough, which makes significant the degree to which incident light reflects away from, and scatters off, it. The first oxide layer reduces scattering and improves internal reflection of light by achieving an anti-reflection coating. This increases transmission of light through the membrane because the index of reflection between the coating and the membrane are different. Thus, the first oxide layer increases the transparency of the membrane to optical wavelength rays.

In addition, mechanical characteristics of the Xray mask may deteriorate because of over-etching of the membrane when etching the second oxide layer. However, the deterioration is avoidable in the present invention by using the second oxide layer that has an etching selectivity higher than the first oxide layer for an oxide etching solution such as a BOE. Thus, the second oxide layer can be totally removed without removing portions of the first oxide layer and subsequently portions of the membrane. This allows for a stable mask to be fabricated.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of forming an X-ray mask, the method comprising the steps of:

providing a substrate;

forming a membrane on a top side of the substrate;

forming a first oxide layer on the membrane;

forming a second oxide layer on the first oxide layer;

selectively removing the second oxide layer to form a second oxide layer pattern that exposes portions of the first oxide layer;

forming an X-ray absorber layer on the second oxide layer pattern and on the exposed portions of the first oxide layer; and selectively removing the second oxide layer pattern and portions of the X-ray absorber layer to from an X-ray absorber pattern on the first oxide layer.

2. The method of claim 1, wherein the membrane is formed from at least one of a silicon nitride (SiN) type material, a silicon carbide (SiC) type material, and a diamond type material.

3. The method of claim 1, wherein the X-ray absorber layer is formed from at least one of a tungsten (W) type material, tantalum (Ta) type material, and a combination of the tungsten (W) type material and tantalum (Ta) type material.

4. The method of claim 1, wherein the first oxide layer has a different etching selectivity than the second oxide layer.

5. The method of claim 1, wherein the second oxide layer has a higher etching selectivity than the first oxide layer.

6. The method of claim 1, wherein the first oxide layer is formed from at least one of an aluminum oxide ($Al_2O_3$) type material, a magnesium oxide (MgO) type material, and an ITO (Indium Tin Oxide) type material.

7. The method of claim 1, wherein the second oxide layer is formed from at least one of a silicon oxide ($SiO2$) type material, a PSG (Phosphorous Silicate Glass) type of material, a SOG (Spin on Glass) type of material, and an ITO (Indium Tin Oxide) type of material.

8. The method of claim 1, prior to the step of forming a first oxide layer, comprising the steps of:
   forming an etching mask on a bottom side of the substrate that exposes a portion of the substrate; and
   forming a trench in the exposed portion of the substrate using the etching mask.

9. The method of claim 8, wherein the forming a trench step includes the step of:
   selectively removing portions of the exposed substrate.

10. The method of claim 8, wherein the step of forming an X-ray absorber pattern forms the X-ray absorber pattern above the trench.

11. An X-ray mask comprising:
   a substrate;
   a membrane on a top side of the substrate;
   an oxide layer on the membrane; and
   an X-ray absorber pattern on the oxide layer.

* * * * *